（12） United States Patent
Prince et al.

(10) Patent No.: US 7,166,506 B2
(45) Date of Patent: Jan. 23, 2007

(54) POLY OPEN POLISH PROCESS

(75) Inventors: Matthew J. Prince, Portland, OR (US); Francis M. Tambwe, Hillsboro, OR (US); Chris E. Barns, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/015,151

(22) Filed: Dec. 17, 2004

(65) Prior Publication Data

US 2006/0134916 A1    Jun. 22, 2006

(51) Int. Cl.
*H01L 21/8242* (2006.01)

(52) U.S. Cl. ............... 438/243; 438/299; 438/194; 438/529; 438/626; 257/E21.443; 257/E21.444

(58) Field of Classification Search ............. 438/194, 438/291, 529, 626
See application file for complete search history.

(56) References Cited

U.S. PATENT DOCUMENTS 5,891,784 A * 4/1999 Cheung et al. ............ 438/303
6,248,667 B1 * 6/2001 Kim et al. ................. 438/690
6,743,683 B1    6/2004 Barns et al.
2001/0004542 A1 * 6/2001 Woerlee et al. ............ 438/291

\* cited by examiner

*Primary Examiner*—Michael Lebentritt
*Assistant Examiner*—Kyoung Lee
(74) *Attorney, Agent, or Firm*—Robert G. Winkle

(57) ABSTRACT

A method of fabricating microelectronic structure using at least two material removal steps, such as for in a poly open polish process, is disclosed. In one embodiment, the first removal step may be chemical mechanical polishing (CMP) step utilizing a slurry with high selectivity to an interlevel dielectric layer used relative to an etch stop layer abutting a transistor gate. This allows the first CMP step to stop after contacting the etch stop layer, which results in substantially uniform "within die", "within wafer", and "wafer to wafer" topography. The removal step may expose a temporary component, such as a polysilicon gate within the transistor gate structure. Once the polysilicon gate is exposed other processes may be employed to produce a transistor gate having desired properties.

20 Claims, 6 Drawing Sheets

POLY OPEN POLISH PROCESS

BACKGROUND OF THE INVENTION

1. Field of the Invention

An embodiment of the present invention relates to microelectronic device fabrication. In particular, an embodiment of the present invention relates to utilizing multiple material removal steps in a poly open polish process.

2. State of the Art

The microelectronic device industry continues to see tremendous advances in technologies that permit increased integrated circuit density and complexity, and equally dramatic decreases in package sizes. Present semiconductor technology now permits single-chip microprocessors with many millions of transistors, operating at speeds of tens (or even hundreds) of MIPS (millions of instructions per second), to be packaged in relatively small, air-cooled microelectronic device packages.

These transistors are usually metal oxide semiconductor field effect transistors (MOSFET), which are generally made with metal gate electrodes, as will be understood to those skilled in the art. However, because metal can be difficult to etch with sufficient control of critical dimensions and with sufficient selectivity to an underlying gate oxide, a polysilicon gate electrode can be used for the formation of self-aligned sources and drains and for the formation of a microelectronic transistor. In the formation of a microelectronic transistor, at least one dielectric layer is deposited over the microelectronic transistor structure that has a polysilicon gate electrode. The dielectric layer(s) is planarized, such as by a chemical mechanical polish (CMP), down to and exposing the polysilicon gate. This process is called a poly open polish process. The polysilicon gate electrode may then be removed and replaced by a metal electrode (general also replacing the gate oxide with a high-K dielectric layer) having desirable electrical characteristics, or replaced with new polysilicon which may be salicided to achieved desirable electrical characteristics. Additionally, the existing polysilicon gate may simply be salicided after the polysilicon gate is exposed.

Currently, the CMP technique used in the poly open process utilizes a single slurry and single polishing platen to remove the dielectric layer(s) and other layers (such as an etch stop layer(s) and hard mask(s)) to expose the polysilicon gate. The single slurry/single platen process is dependent upon dielectric layer uniformity, polisher hardware variations, and polish rate variations caused by consumable variations. Furthermore, there is no endpoint with the single slurry/single platen process.

The lack of control with the poly open process is a problem because the dimensions (e.g., height) of the transistor gate must be substantially consistent within each device (WID) to have a properly functioning device, within the wafer (WIW) to have consistent performance between devices formed on each microelectronic wafer, and from wafer to wafer (WTW) to have consistent performance across all devices produced.

Therefore, it would be advantageous to develop a poly open process which has greater control over the WID uniformity, WIW uniformity, and WTW uniformity.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
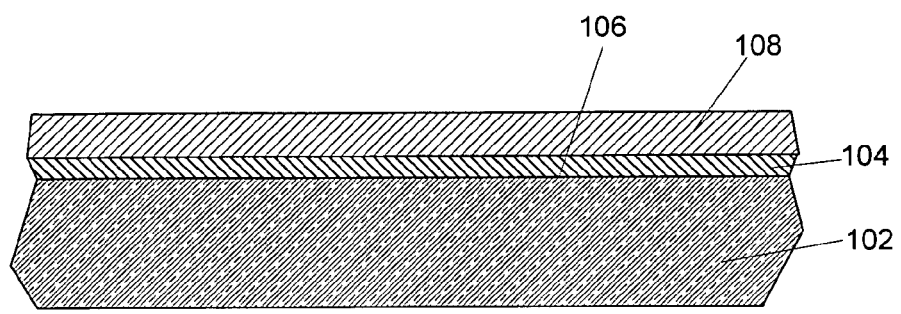
FIG. 1 is a side cross-sectional view of a portion of a microelectronic substrate having a gate oxide layer disposed thereon and a polysilicon layer on the gate oxide layer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

An embodiment of the present invention relates to the fabrication of a microelectronic transistor by the use of at least two chemical mechanical polishing (CMP) steps in a poly open polish (POP) process. The first CMP step utilizes a slurry (e.g., a ceria-based abrasive slurry) with high selectivity to an interlevel dielectric layer used (e.g., silicon oxide) relative to an etch stop layer (e.g., silicon nitride) abutting a transistor gate structure. This allows the first CMP step to stop after contacting the etch stop layer, which results in substantially uniform "within die", "within wafer", and "wafer to wafer" topography. The second CMP step utilizes a second slurry (e.g., silica based slurry) with a different selectivity from the first CMP step which polishes through any remaining etch stop layer and/or any other structural layer, such as a hardmask to expose a temporary component, such as a polysilicon gate, within the transistor gate. Once the temporary component (i.e., polysilicon gate) is exposed other processes may be employed to produce a transistor gate having desired properties, as will be understood to those skilled in the art. A temporary component is understood to be a component which will be removed or have its electrical characteristics changed in processing steps subsequent to its formation.

It is, of course, understood that although the present invention is described in terms of exposing a temporary component within a microelectronic transistor gate, the present invent is not so limited. As it will be understood to those skilled in the art, the present invention can be applied to any situation where a portion of a microelectronic structure needs to be exposed, but control of the parameters of exposure, such as maintaining the dimensions of the microelectronic structure, needs be maintained.

Figure 2:
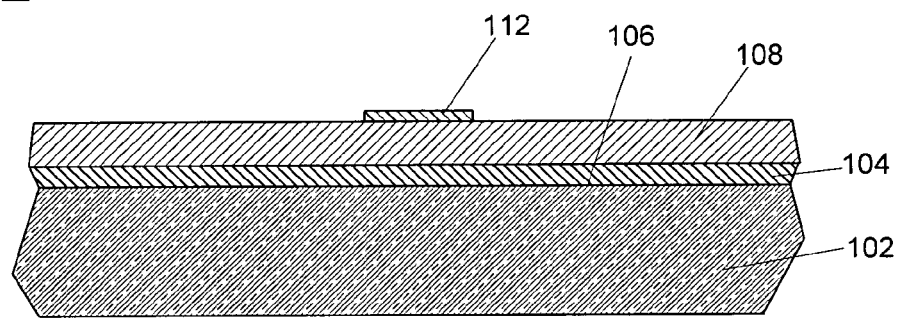
FIG. 2 is a side cross-sectional view of the assembly of FIG. 1, wherein a hardmask is patterned on the polysilicon layer, according to the present invention.
Figure 3:
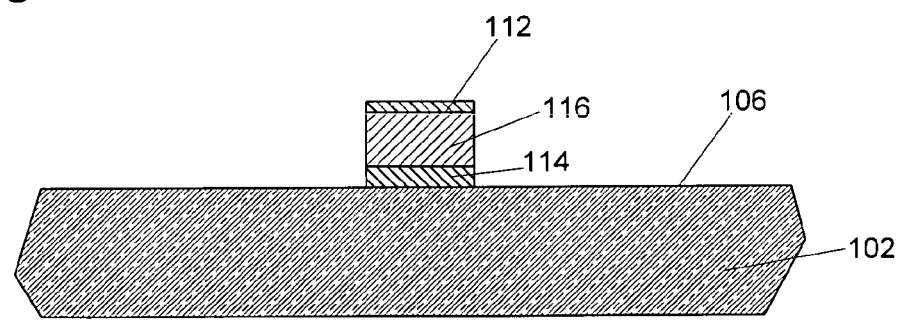
FIG. 3 is a side cross-sectional view of the assembly of FIG. 2, wherein portions of the polysilicon layer and the gate oxide layer not protected by the hardmask are etched to form a polysilicon gate electrode and a gate oxide on the microelectronic substrate, according to the present invention.

FIGS. 1–12 illustrate a method of fabricating a microelectronic transistor according to the present invention. FIG. 1 shows a microelectronic substrate 102 (such as a microelectronic wafer) having a gate oxide layer 104 on a first surface 106 of the microelectronic substrate 102 and a polysilicon layer 108 deposited on the gate oxide layer 104. As shown in FIG. 2, a hardmask 112, such a photoresist material or a material which can selectively stop an etch such as silicon oxide, silicon oxynitride, carbon doped nitride, and silicides, is patterned on the polysilicon layer 108. Portions of the polysilicon layer 108 and the gate oxide layer 104 not protected by the hardmask 112 are etched away (such as by dry plasma etching) to form a temporary component (illustrated as a polysilicon gate electrode 116) and a gate oxide 114 on the microelectronic substrate 102, as shown in FIG. 3.

Figure 4:
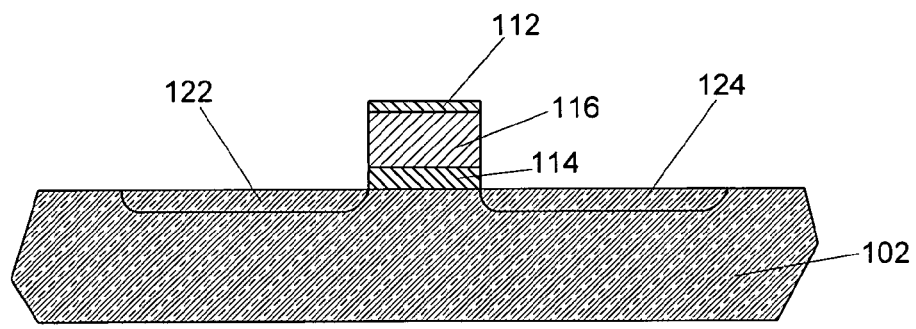
FIG. 4 is a side cross-sectional view of the assembly of FIG. 3, wherein a lightly doped source region and a lightly doped drain region are formed on opposing sides of the polysilicon gate electrode, according to the present invention.
Figure 5:
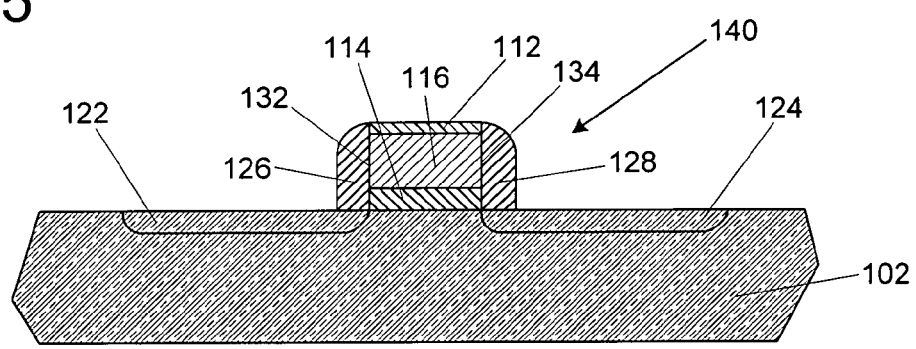
FIG. 5 is a side cross-sectional view of the assembly of FIG. 4, wherein the spacers are formed on opposing sides of the polysilicon gate electrode to form a transistor gate structure, according to the present invention.
Figure 6:
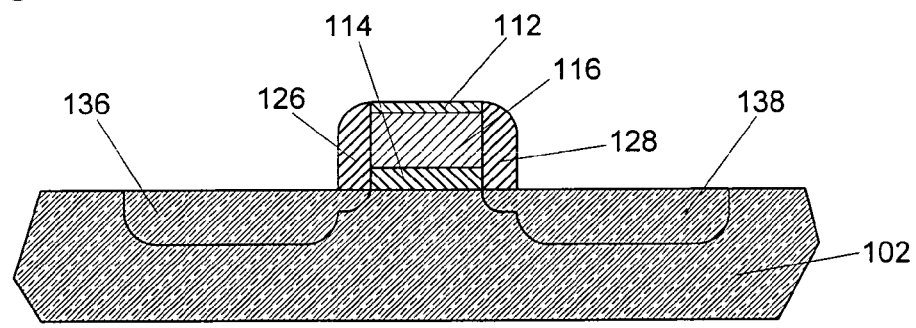
FIG. 6 is a side cross-sectional view of the assembly of FIG. 5, wherein a source region and a drain region are formed on opposing sides of the transistor gate structure, according to the present invention.

As shown in FIG. 4, at least one first ion implantation is made into the microelectronic substrate 102 to form a lightly doped source region 122 and a lightly doped drain region 124 on opposing sides of the polysilicon gate electrode 116. For a p-channel device, a p-type dopant, such as boron, may be implanted into the lightly doped source region 122 and the lightly doped drain region 124 region. As shown in FIG. 5, a first sidewall spacer 126 and an second sidewall spacer 128 are formed proximate a first side 132 and an opposing second side 134 of polysilicon gate electrode 116, respectively, to form a transistor gate structure 140. As will be understood to those skilled in the art, the first sidewall spacer 126 and the second sidewall spacer 128 are formed by the deposition of at least one dielectric material layer (such as by a low pressure chemical vapor deposition), which is etched back (such as by a dry etch) to define the first sidewall spacer 126 and the second sidewall spacer 128. As shown in FIG. 6, at least one second ion implantation is made into the microelectronic substrate 102 to form a source region 136 and a drain region 138. For a p-channel device, a p-type dopant, such as boron, is implanted into the source region 136 and the drain region 138.

Figure 7:
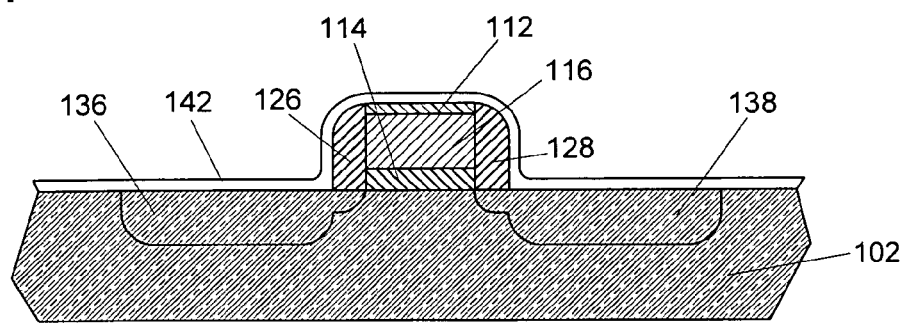
FIG. 7 is a side cross-sectional view of the assembly of FIG. 6 having a metal layer disposed over the transistor gate structure and the microelectronic substrate, according to the present invention.
Figure 8:
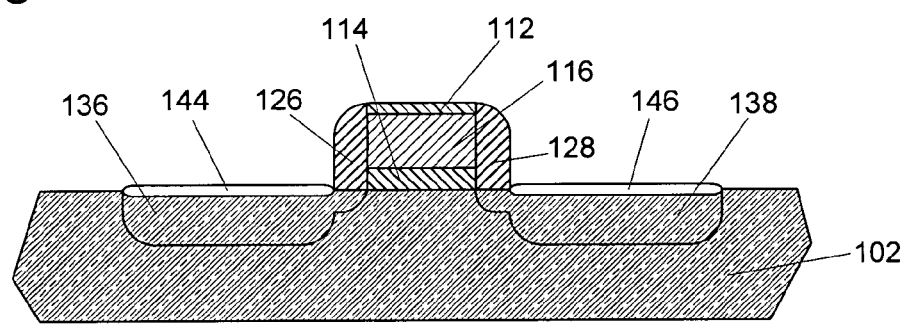
FIG. 8 is a side cross-sectional view of the assembly of FIG. 7 having silicide layers formed over the source region and the drain region, according to the present invention.

A metal layer 142, such as cobalt or nickel, may be deposited over the microelectronic substrate 102, the first sidewall spacer 126, the second sidewall spacer 128, and the hardmask 112, as shown in FIG. 7. The assembly is then heated, such as by a rapid thermal processing technique. The metal layer 142 reacts with silicon within the microelectronic substrate 102, where there is contact therewith, to form a first metal salicide layer 144 over the source region 136 and a second metal salicide layer 146 over the drain region 138. Unreacted metal, which does not react with silicon within the microelectronic substrate 102 to form the silicide layers, is removed, as shown in FIG. 8.

Figure 9:
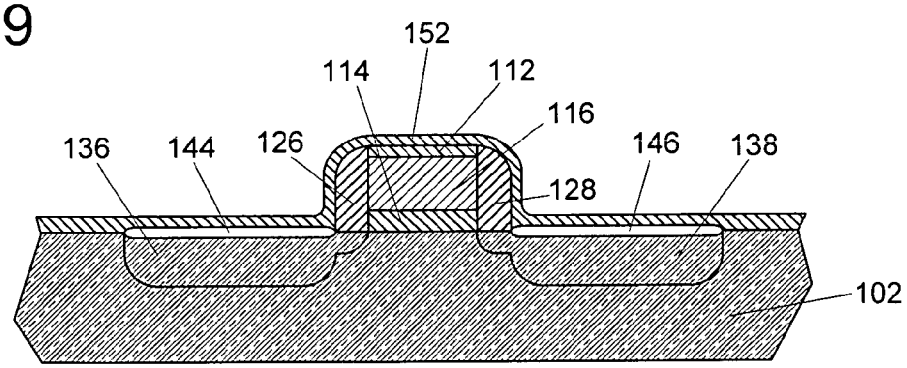
FIG. 9 is a side cross-sectional view of the assembly of FIG. 8, wherein an etch stop layer is formed over the transistor gate structure and the microelectronic substrate, according to the present invention.
Figure 10:
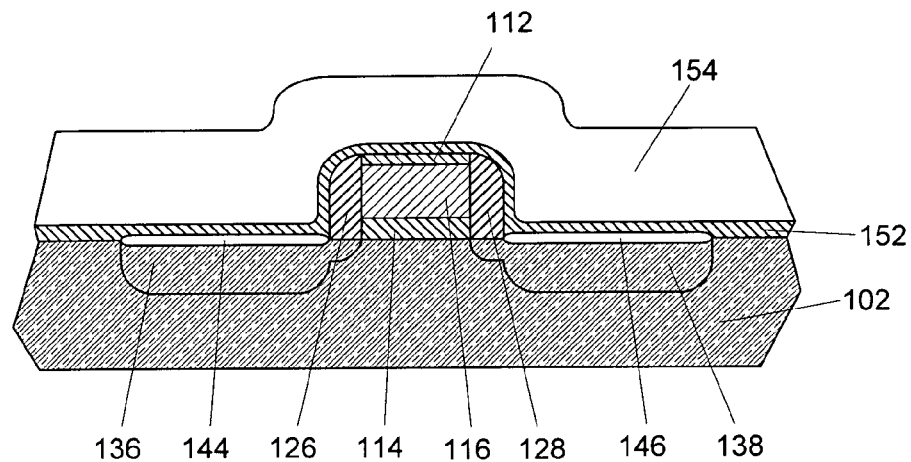
FIG. 10 is a side cross-sectional view of the assembly of FIG. 9, wherein an interlevel dielectric layer is formed on the etch stop layer, according to the present invention.

As shown in FIG. 9, an etch stop material, such as silicon nitride (preferred), silicon oxide, silicon oxynitride, carbon doped nitride, and suicides, is deposited, such as by a plasma enhanced chemical vapor deposition process, over the microelectronic substrate 102, the first sidewall spacer 126, the second sidewall spacer 128, and the hardmask 112 to form an etch stop layer (ESL) 152. As shown in FIG. 10, an interlevel dielectric, such as silicon dioxide, is deposited over the ESL 152 to form an interlevel dielectric layer 154. The ESL 152 and the interlevel dielectric layer 154 both substantially follow the topography of the underlying structure, including the first sidewall spacer 126, the second sidewall spacer 128, the hardmask 112, and the microelectronic substrate 102.

Figure 11:
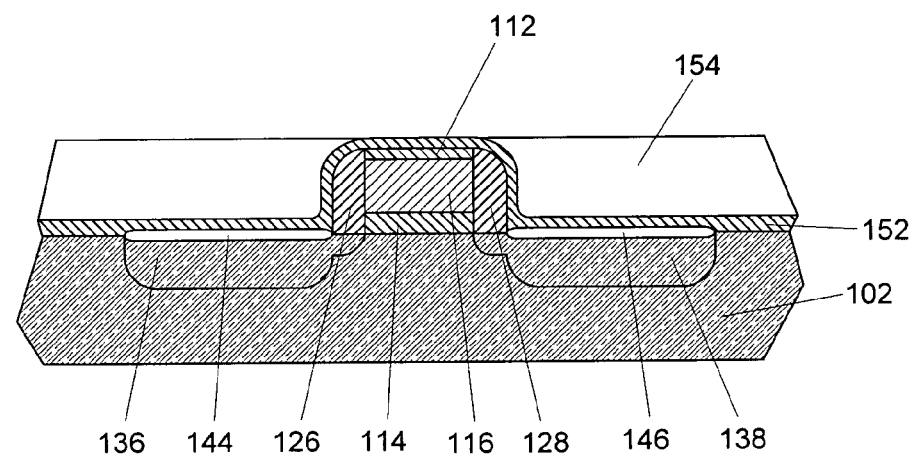
FIG. 11 is a side cross-sectional view of the assembly of FIG. 10, wherein a portion of the interlevel dielectric layer is removed down to or in the etch stop layer abutting the transistor gate structure, according to the present invention.

The assembly of FIG. 10 is then polished by a first chemical mechanical polishing (CMP) process to removed a portion of the interlevel dielectric layer 154, as shown in FIG. 11. The CMP process involves contacting a material layer to be polished with a rotating polishing pad. An abrasive slurry comprising an abrasive suspended in an aqueous solution, which may also contain chemical constituents to achieve selectively, is disposed between the polishing pad and the material layer to be polished, as will be understood to those skilled in the art. The material layer to be polished is then polished away with the polish pad and slurry to achieve a desired removal.

In an embodiment of the present invention, a ceria-based abrasive slurry is used in the first CMP process. The ceria-based slurry is formulated to polish away the interlevel dielectric layer 154 stopping after contacting the ESL 152. In other words, the ceria-based slurry has a very low ESL 152 removal rate relative to its removal rate of the interlevel dielectric layer 154. Thus, after the ESL 152 over the polysilicon gate electrode 114 is contacted, the removal of the interlevel dielectric layer 154 stops, and because the removal stops after the ESL 152 is contacted over-polishing/ over-removal of the interlevel dielectric layer 154 may be prevented or minimized. The result is that substantially all areas across the microelectronic substrate 102 have substantially the same, uniform topography.

Figure 12:
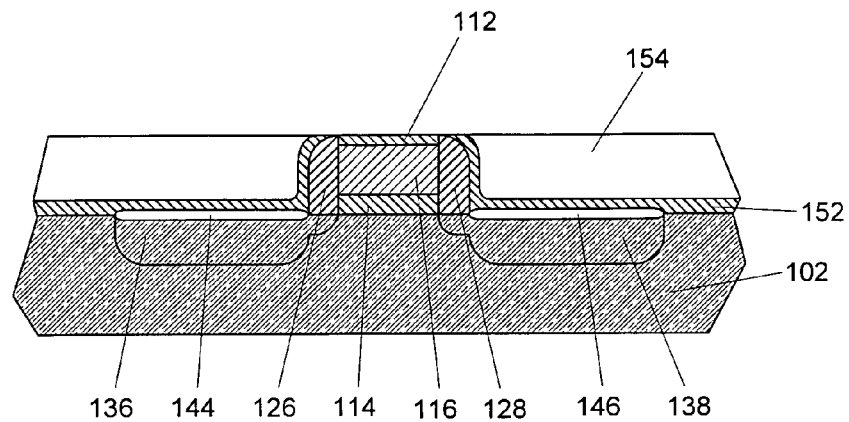
FIG. 12 is a side cross-sectional view of the assembly of FIG. 10, wherein a portion of the interlevel dielectric layer is removed down to or in the hardmask of the transistor gate structure, according to the present invention.

It understood that in the first CMP removal does not necessary stop immediately upon contact with the ESL 152. The first CMP process may completely remove the ESL 152 over the polysilicon gate electrode 114 and stop after contacting the hardmask 112 over the polysilicon gate electrode 114, as shown in FIG. 12, and may even remove the hardmask 112.

In one embodiment of the present invention, the ceria-based slurry includes suppressants to make the slurry selective to the interlevel dielectric layer 154 (e.g., silicon oxide) with a removal rate greater than twice the removal rate for the ESL 152 (e.g., silicon nitride). In one embodiment, the ceria-based slurry may be TiZOX™ 8268 available from Ferro Corporation, Cleveland, Ohio, USA, SiLECT™ 6000 available from Cabot Microelectronics, Aurora, Ill., USA, and GPX™ available from Hitachi, Ltd., Tokyo, Japan. Exemplary polish pads used may include hard urethane pads, such as IC-1000, IC-1010, or IC-1020 available from Rohm & Hass Electronic Materials, Philadelphia, Pa., USA, or urethane pads from JSR Micro, Sunnyvale, Calif., USA. Exemplary operating parameters may include polish platen rotations in the range between about 10 and 150 RPMs, between about 10 and 150 RPMs for the wafer carrier, polish pressures of between about 0.5 and 7 psi, slurry flow of between about 50 and 500 ml/min, and polish temperatures of between about 15 and 40 degrees Celsius. The polishing time would be dependent on the amount of material to be removed. However, an exemplary duration would be between about 30 and 180 seconds. Additionally, pad conditioning may be performed with a diamond abrasive disk.

Figure 14:
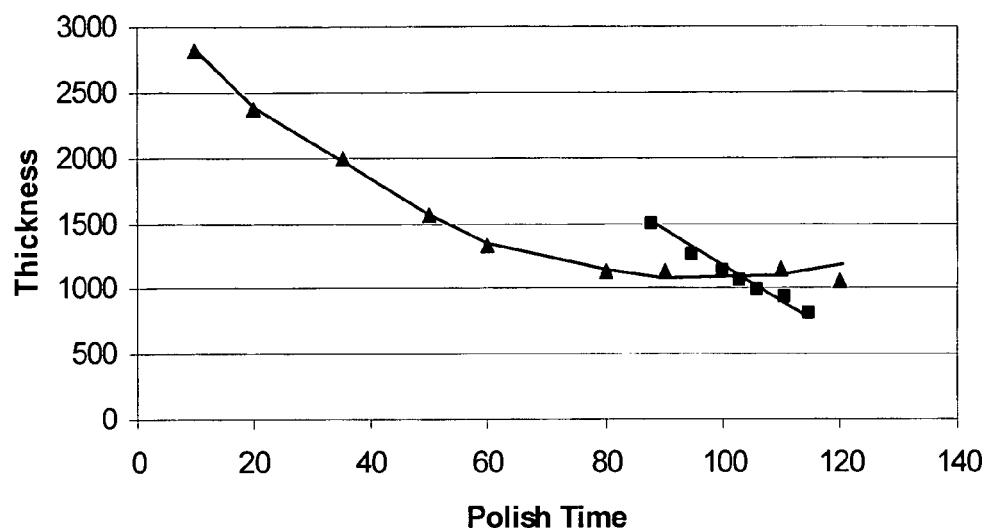
FIG. 14 is a chart of polish time versus interlevel dielectric layer thickness, according to the present invention.

The data shown in FIG. 14 was produced by polishing an undoped glass (i.e., silicon oxide) down to a silicon nitride etch stop with a ceria-based slurry (i.e., Ferro Tizox™ 8268) in an Applied Materials Reflexion™ Polisher (available from Applied Materials of Santa Clara, Calif., USA), the pressure between a wafer and a Rohm and Haas IC-1020 polishing pad can be between about 1 and 5 psi, with 3 psi for the experimental data. The speed of rotation of the polishing pad may be between about 30 and 40 RPMs, with 36 RPMs for the experimental data. The slurry may be delivered at a rate of between about 200 and 400 ml/min, with 300 ml/min for the experimental data.

Figure 15:
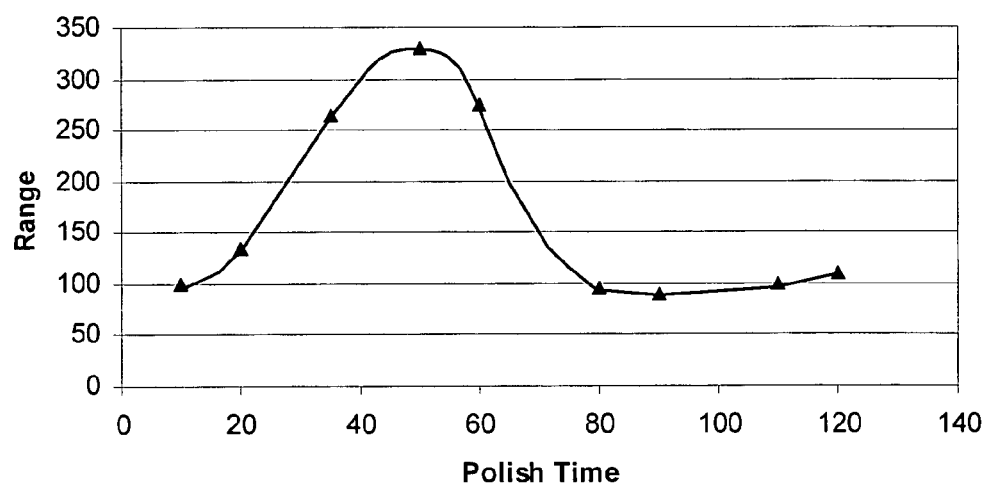
FIG. 15 is a chart of polish time versus uniformity range, according to the present invention.

As will be seen in FIG. 14, the structure began with a thickness of about 3000 angstroms. Following the triangles in FIG. 14, after about 40 seconds, the silicon oxide was removed down to the silicon nitride etch stop layer at a thickness of about 1100 angstroms. Even with a continued polish time, the thickness remained substantially the same. This can be compared with the single polishing process, discussed above, shown with diamonds in FIG. 14, wherein the removal continued substantially linearly through the silicon nitride etch stop layer. Thus, with the present invention, the topography will be substantially uniform "within die", "within wafer", and "wafer to wafer", because all polishing for the first CMP process stops at substantially the same point. In fact, it has been found that uniformity variations are reduced to about one-third of those found in a single polishing process. This uniformity is demonstrated in FIG. 15 with regard to "within wafer" uniformity. Essentially, the uniformity range reaches a lower limit and remains unchanged at about 100 angstroms during overpolish. In the known single polishing process, the nominal uniformity is between about 150 and 250 angstroms.

Figure 13:
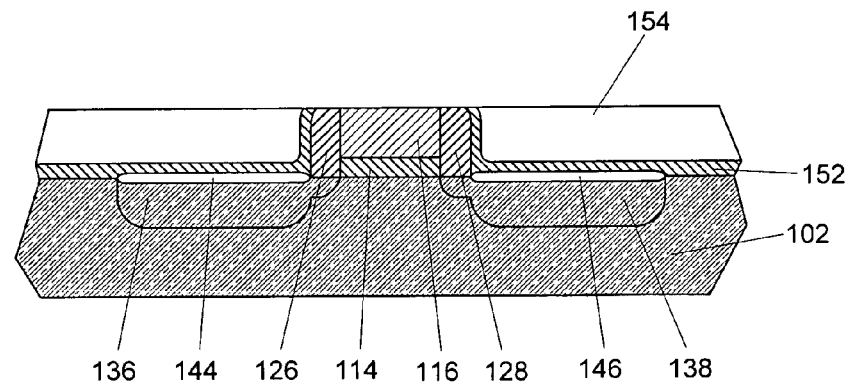
FIG. 13 is a side cross-sectional view of the assembly of FIG. 11, wherein a portion of the etch stop layer is the removed and the polysilicon gate electrode is exposed, according to the present invention.

Once the first CMP process has stopped after contacting the ESL 152, the resulting structure of FIG. 11 or FIG. 12 is polished by a second chemical mechanical polishing (CMP) to expose the polysilicon gate 116, as shown in FIG. 13. With the structure of FIG. 11, the second CMP may substantially uniformly remove a portion of the ESL 152 proximate the hardmask 112 and removes the hardmask 112 to expose the polysilicon gate 116. With the structure of FIG. 12, the second CMP would remove the remaining hardmask 112 to expose the polysilicon gate 116. In one embodiment of the present invention, the second CMP slurry comprises a silica abrasive slurry, such as A2000 available from Planar Solutions, LLC, Adrian, Mich., USA which is adjusted to a pH between about 6.5 and 8.0, preferably about 7.2. The pressure between a wafer and a Rohm and Haas IC-1020 polishing pad can be between about 1 and 5 psi, with 3 psi for the experimental data. The speed of rotation of the polishing pad may be between about 30 and 40 RPMs, with 36 RPMs for the experimental data. The slurry may be delivered at a rate of between about 200 and 400 ml/min, with 300 ml/min for the experimental data. In one embodiment, the second CMP slurry may be formulated to remove the ESL 152 at a rate equal to or greater than the removal rate of the interlevel dielectric layer 154. In other embodiment, the removal rate of the ESL 152 is about twice or greater the removal rate of the interlevel dielectric layer 154.

It is, of course understood that a second removal step to expose the polysilicon gate 116 need not be a CMP removal process, but may also include any material removal process known in the art, such as various etching processes.

It has been found that the second CMP process also removes contamination from the first CMP process (such as ceria contamination), which would otherwise require a separate cleaning chemistry to eliminate. As will also be understood to those skilled in the art, a third CMP process may be employed to buff and clean the resulting surfaces, after the first CMP process and the second CMP process.

As will be further understood to those skilled in the art, once the polysilicon gate electrode 116 is exposed, it may be removed, such as by a wet etch. After removal of the polysilicon gate electrode 116, the gate oxide 114 can be removed and replaced with a material with a high dielectric constant, including but limited to tantalum oxide, titanium oxide, hafnium oxide, and zirconium oxide. Of course, removal of the gate oxide 114 can be omitted, especially if it is not damaged during the removal of the polysilicon gate electrode 116. A metal gate electrode can be disposed abutting the gate oxide 114. A metal gate electrode can include, but is not limited to, titanium, platinum, molybdenum, aluminum, ruthenium, including alloys, oxides and nitrides, and the like. A barrier layer can also be formed between the gate oxide and the metal gate electrode. Furthermore, the polysilicon gate electrode 116 can be removed and replaced with a polysilicon material that is salicided with a metal, including but not limited to cobalt, nickel, titanium, and the like. Moreover, rather than removing the original polysilicon gate electrode 116, it may be salicided to achieve desired electrical properties.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method comprising:
   providing a structure including a temporary component;

forming an etch stop layer abutting said structure;

forming an interlevel dielectric layer abutting said etch stop layer; and performing a first removal step and a second removal step through said interlevel dielectric layer and said etch stop layer to expose said structure temporary component, wherein performing said second removal step comprises chemical mechanical polishing to expose said structure temporary component.

2. The method of claim 1, wherein performing said first removal step comprises performing a first removal step to remove a portion of said interlevel dielectric layer.

3. The method of claim 1, wherein performing said first removal step comprises performing a chemical mechanical polish.

4. The method of claim 1, wherein providing a structure comprises providing a microelectronic transistor structure.

5. The method of claim 4, wherein providing a microelectronic transistor structure comprises providing a microelectronic transistor structure including a temporary component comprising a polysilicon gate electrode.

6. A method of fabricating a microelectronic structure, comprising:

providing a structure on a microelectronic substrate, said structure having a temporary component;

forming an etch stop layer abutting said structure and at least a portion of said microelectronic substrate;

forming an interlevel dielectric layer abutting said etch stop layer;

chemical mechanical polishing a portion of said interlevel dielectric layer with a slurry adapted to selectively remove said interlevel dielectric layer relative to said etch stop layer; and performing a second chemical mechanical polishing to expose said temporary component.

7. The method of claim 6, wherein providing a structure on a microelectronic substrate comprises providing a microelectronic transistor structure.

8. The method of claim 6, wherein providing a microelectronic transistor structure comprises providing a microelectronic transistor structure including a temporary component comprising a polysilicon gate electrode.

9. The method of claim 6, wherein removing a portion of said etch stop layer comprises chemical mechanical polishing a portion of said etch stop layer with a slurry adapted to remove said etch stop layer to expose said polysilicon gate electrode.

10. A method of fabricating a microelectronic structure, comprising:

providing a transistor gate structure on a microelectronic substrate, said transistor gate structure having a temporary component;

forming an etch stop layer abutting said transistor gate structure and at least a portion of said microelectronic substrate;

forming an interlevel dielectric layer abutting said etch stop layer;

removing a portion of said interlevel dielectric layer by chemical mechanical polishing said interlevel dielectric layer with a first slurry of a first selectivity; and removing a portion of said etch stop layer by chemical mechanical polishing said etch stop layer with a second slurry of a second selectivity different from said first slurry to expose said structure temporary component.

11. The method of claim 10, wherein removing a portion of said interlevel dielectric comprises removing a portion of said interlevel dielectric layer to expose said etch stop layer.

12. The method of claim 10, wherein providing transistor gate structure further includes a hardmask disposed between said etch stop layer and said temporary component.

13. The method of claim 10, wherein providing transistor gate structure having said temporary component comprises providing transistor gate structure having a polysilicon gate electrode as said temporary component.

14. The method of claim 10, wherein removing a portion of said interlevel dielectric layer comprises chemical mechanical polishing said interlevel dielectric layer with an oxide selective slurry.

15. The method of claim 10, wherein removing a portion of said interlevel dielectric layer comprises chemical mechanical polishing said interlevel dielectric layer with a ceria-based slurry.

16. The method of claim 10, wherein forming said interlevel dielectric layer comprises disposing a silicon oxide material layer.

17. The method of claim 10, wherein removing a portion of said etch stop layer comprises chemical mechanical polishing said etch stop layer with a nitride selective slurry.

18. The method of claim 10, wherein forming said etch stop layer comprises disposing a silicon nitride layer.

19. A method of fabricating a microelectronic structure, comprising:

forming a gate oxide layer on a microelectronic substrate;

forming a polysilicon layer abutting said gate oxide layer;

patterning a hardmask on said polysilicon layer;

etching a portion of said polysilicon layer and said gate oxide layer not protected by said hardmask to form polysilicon gate electrode and a gate oxide;

forming spacers on opposing sides of said polysilicon gate electrode to form a transistor gate structure;

forming an etch stop layer abutting said transistor gate structure and at least a portion of said microelectronic substrate;

forming an interlevel dielectric layer abutting said etch stop layer;

performing a first removal step and a second removal step through said interlevel dielectric layer and said etch stop layer to expose said structure temporary component, wherein performing said second removal step comprises chemical mechanical polishing to expose said structure temporary component.

20. The method of claim 19, wherein performing said first removal step comprises chemical mechanical polishing said interlevel dielectric layer.

* * * * *